US005623416A

United States Patent [19]

Hocker, III

[11] Patent Number: 5,623,416

[45] Date of Patent: Apr. 22, 1997

[54] CONTACT CLOSURE DATA LOGGER

[75] Inventor: Lon O. Hocker, III, Falmouth, Mass.

[73] Assignee: Onset Computer Corporation, Pocasset, Mass.

[21] Appl. No.: 369,687

[22] Filed: Jan. 6, 1995

[51] Int. Cl.$^{6}$ .................................................. G01R 19/00

[52] U.S. Cl. ......................... 364/483; 364/420; 364/550; 364/509; 364/481

[58] Field of Search .................................... 364/483, 550, 364/420, 424.04, 509, 510, 481, 551.01; 73/863.01, 170.17, 170.18, 170.21–0.23, 861.41, 291; 340/602, 644; 200/61.04, 61.06, 61.07; 307/116; 324/694; 137/78.1–78.3; 346/20; 405/36, 37, 39, 92

[56] References Cited

U.S. PATENT DOCUMENTS

| | | | |
|---|---|---|---|
| 4,035,786 | 7/1977 | Yamauchi et al. | 340/654 |
| 4,057,785 | 11/1977 | Furniss et al. | 340/870.15 |
| 4,845,486 | 7/1989 | Knight et al. | 340/618 |
| 4,910,692 | 3/1990 | Outram et al. | 340/690 |
| 5,016,196 | 5/1991 | Nelson et al. | 73/170.17 |
| 5,342,144 | 8/1994 | McCarthy | 405/39 |
| 5,394,748 | 3/1995 | McCarthy | 73/170.18 |
| 5,451,879 | 9/1995 | Moore | 340/644 |

OTHER PUBLICATIONS

Product Profile, Feb. 1994, Joan Gregerson, p. 1.
Tech Update, Apr. 1994, Joan Gregerson, pp. 4–5.
ACR U.S. Price List, Jul. 1, 1991 p. 1.
Ordering guide, date unknown, but prior to Jan. 6, 1995 p. 1.
Telog LC–800 Series Linecorders, Jun. 1990 pp. 5–6.
Telog Flow Data Recording, Sep. 1989, p. 4.
Telog R–2400 Automated Data Acquisition and Communications System, Dec. 1989, p. 4.

*Primary Examiner*—Emanuel T. Voeltz
*Assistant Examiner*—Hal D. Wachsman
*Attorney, Agent, or Firm*—Weingarten, Schurgin, Gagnebin & Hayes LLP

[57] ABSTRACT

A contact closure data logger which monitors state changes in a main switch, and records the time at which the state changes occur. To conserve power and accommodate less capable microprocessors, monitoring is done on a discreet basis. Various types of switches can be used, such as reed switches, FETs and mechanical switches, making the logger particularly useful for energy usage monitoring studies and retrofit of tipping bucket rain gauges. Dependent switches and measurement devices can be arranged in a hierarchical fashion to be monitored and otherwise acted upon when state changes occur in the main switch.

3 Claims, 7 Drawing Sheets

CONTACT CLOSURE DATA LOGGER

TECHNICAL FIELD

This invention relates to data loggers, and more particularly to a versatile, low power, low cost contact closure data logger which records the time at which an event occurs.

BACKGROUND OF THE INVENTION

Remote data logging systems which monitor physical properties such as temperature or relative humidity over extended periods of time are well known in the art. Such systems usually consist of a plurality of data loggers and a host computer. Each data logger is configured for its mission while connected to the host computer. After being configured, the logger is disconnected from the host and placed in its monitoring site, e.g., placed in a crate of fruit to monitor temperature at predetermined intervals during transit. After the mission is complete, the logger is reconnected to the host and the logger's data is downloaded to the host.

There are two variations on the basic data logger design which are also known in the art. One variation is the "event logger." Event loggers are designed to record data during a relatively short event, such as an earthquake, while conserving available memory and power during the periods between events. An earthquake event logger samples and records high resolution data during the quake, but samples and records little or no data before and after the quake. The other variation is the "pulse recorder." Pulse recorders count pulses over a given period of time. Data is then provided in the form of pulses per period. Pulse recorders are useful in connection with devices such as Geiger counters. The basic data logger design and these two variations allow a great variety of monitoring tasks to be carried out. Nevertheless, there are a number of other monitoring tasks which people are interested in, and for which no practical data logging device is available.

SUMMARY OF THE INVENTION

An object of the present invention is to provide a contact closure data logger.

Another object of the present invention is to provide a data logger for recording time and duration of switch state changes.

Another object of the present invention is to provide a data logger suited to energy usage monitoring studies.

Another object of the present invention is to provide a data logger for monitoring repetitive mechanical and electrical actions, and more particularly a data logger which is superior to pulse recorders for such monitoring.

Another object of the present invention is to provide a data logger suited to use with a tipping bucket rain gauge.

Another object of the present invention is to provide a low power contact closure logger which is capable of extended missions without battery replacement.

Another object of the present invention is to provide a low cost contact closure data logger which can operate under the control of a simple microcontroller.

According to the present invention, a contact closure data logger which monitors state changes which occur at a given time, comprises: a microcontroller which executes a control program; a memory operationally connected to said microcontroller; a switch connected between said microcontroller and a ground, said switch having two states; and means for supplying a voltage across said switch; wherein said control program directs said microcontroller to monitor the voltage across said switch to check for state changes in said switch, and record the time at which at least one particular state change occurs.

The present invention provides a data logger which is well suited for monitoring repetitive mechanical actions. The switch of the present invention can be used to monitor virtually any repetitive mechanical action without interfering with the action, and without expensive peripheral components. A non-contact switch, such as reed switch, can be used in place of a mechanical switch to monitor an action without bleeding energy from the action in order to operate the switch.

The present invention provides a data logger which is superior to pulse recorders for monitoring certain mechanical actions. A wide variety mechanical actions can be monitored with pulse recorders. However, complex microcontrollers or external counters and other peripherals are needed to keep track of pulses. Further, pulse recorders do not record the time at which each event occurs. The present invention provides a much simpler, less costly and more versatile logger for monitoring mechanical actions. Most significantly, the contact closure logger of the present invention records the time at which each event occurs.

Other objects, features and advantages of the invention will become apparent in light of the following description thereof.

BEST MODE FOR CARRYING OUT THE INVENTION

Figure 1:
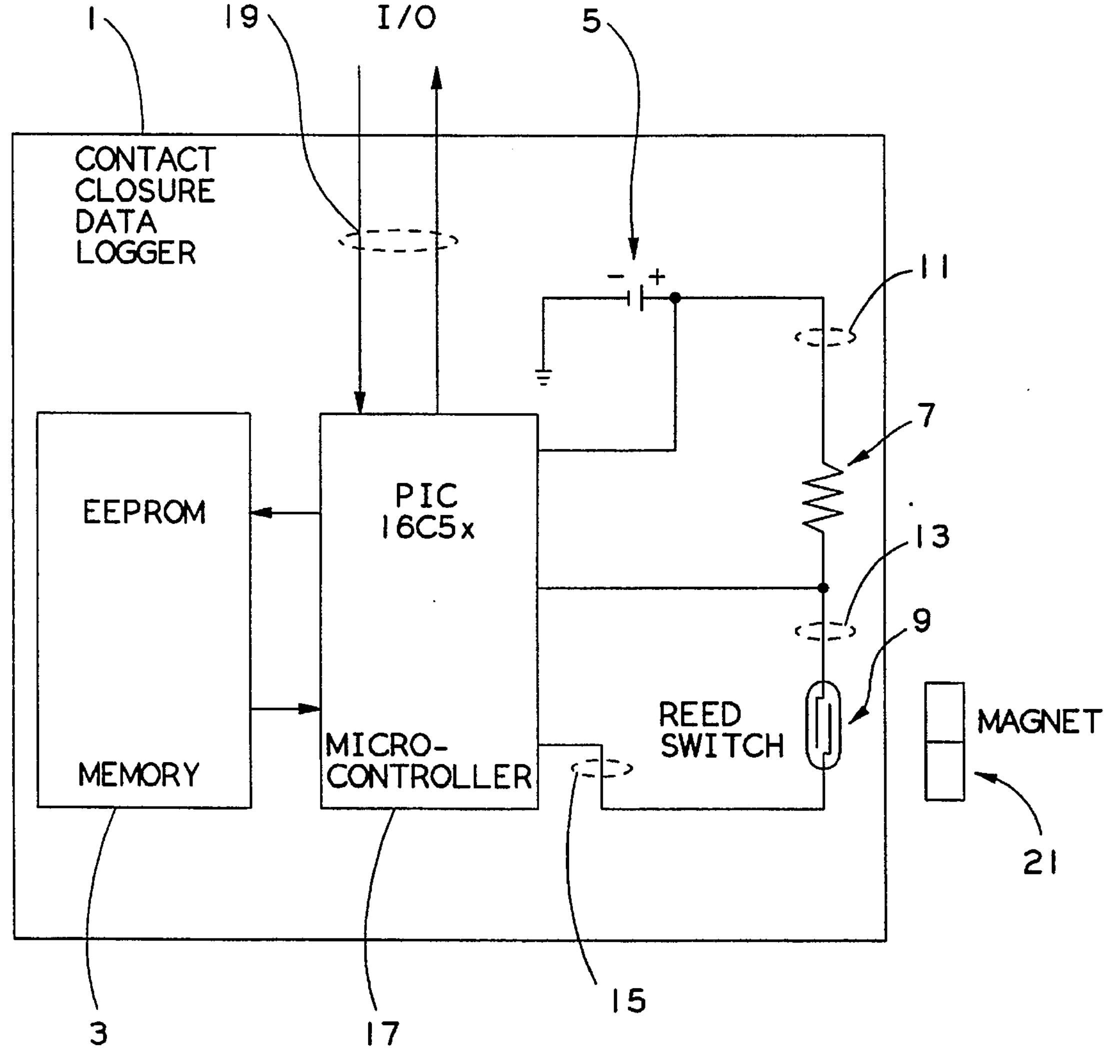
FIG. 1 is a schematic/block diagram of a contact closure data logger according to the present invention.

FIG. 1 is a schematic/block diagram of a contact closure data logger 1 according to the present invention. The logger includes a memory 3, a voltage source 5, a current limiting resistor 7, a switch 9, a reference voltage line 11, an output voltage line 13, a switched reference line 15 and a microcontroller 17 with communication means 19. The microcontroller is connected to the memory, in which contact closure data is stored. In the preferred embodiment, the memory 3 is non-volatile, e.g., EEPROM, so that data will not be lost if the logger 1 loses power. The microcontroller 17 includes communication means 19 to send data to the outside world for analysis, and to accept mission configuration parameters. The voltage source 5, such as a battery, is connected to the microcontroller 17 and the current limiting resistor 7 by the reference voltage line 11. The output voltage line 13 connects the microcontroller 17, the current limiting resistor 7 and the switch 9. The switch is connected between the switched reference line 15 and the output voltage line 13. The switched reference line connects the microcontroller to the switch.

The logger 1 operates to monitor the state of the switch 9, and act upon perceived changes of state. The logger's operation is managed by the microcontroller 17 which, in the preferred embodiment, is selected from the PIC 16C5x series of microcontrollers manufactured by Microchip, Inc. However, any common microcontroller can be used to create a functional data logger according to the present invention. The PIC is used in the preferred embodiment because of its low power consumption and low cost. The PIC executes a control program (See FIG. 2) which monitors the output voltage line 13. Depending on which microcontroller is used and the preference of the programmer, the control program may be written in a high level language such as C, BASIC, Pascal, and Fortran, or a machine code, or any other suitable language. The state of the switch (open or closed) is monitored by sampling the output voltage line 13. Just prior to sampling the output voltage line, the switched reference line 15 is pulled to ground by the microcontroller 17. When the output voltage line is sampled, the output voltage line is pulled up by the voltage source 5 if the switch 9 is open. Conversely, the output voltage line is pulled down by the switched reference line 15 when the switch 9 is closed. The current limiting resistor 7 functions to prevent shorting the voltage source 5 when the switch is closed. The switched reference line is pulled up to the level of the positive reference voltage for the periods between sampling in order to minimize current drain. The microcontroller can thus provide either a ground or a positive reference on the switched reference line.

When a switch state change is detected, a record of the state change is stored in the memory 3. The microcontroller 17 stores an initial state and then compares each subsequent sampling of the output voltage line 13 to the initial state. When a change is detected, the new state replaces the initial state and subsequent sampling is then compared to that state, until another state change is detected. The microcontroller also keeps track of time, and when a state change is detected the time at which the change occurred is stored in the memory.

Various switches can be used depending on the mission of the logger. In FIG. 1 a reed switch is shown. The reed switch is closed by a magnet 21 and thus has the advantage of not bleeding energy from the action being monitored. The type of switch 9 used in practice will be determined by the type of action the logger 1 is destined to monitor. For door opening and closing and tipping bucket rain gauges, reed switches and mechanical switches are suitable. For other actions, a field effect transistor (FET) or other switching device might be used.

Figure 2:
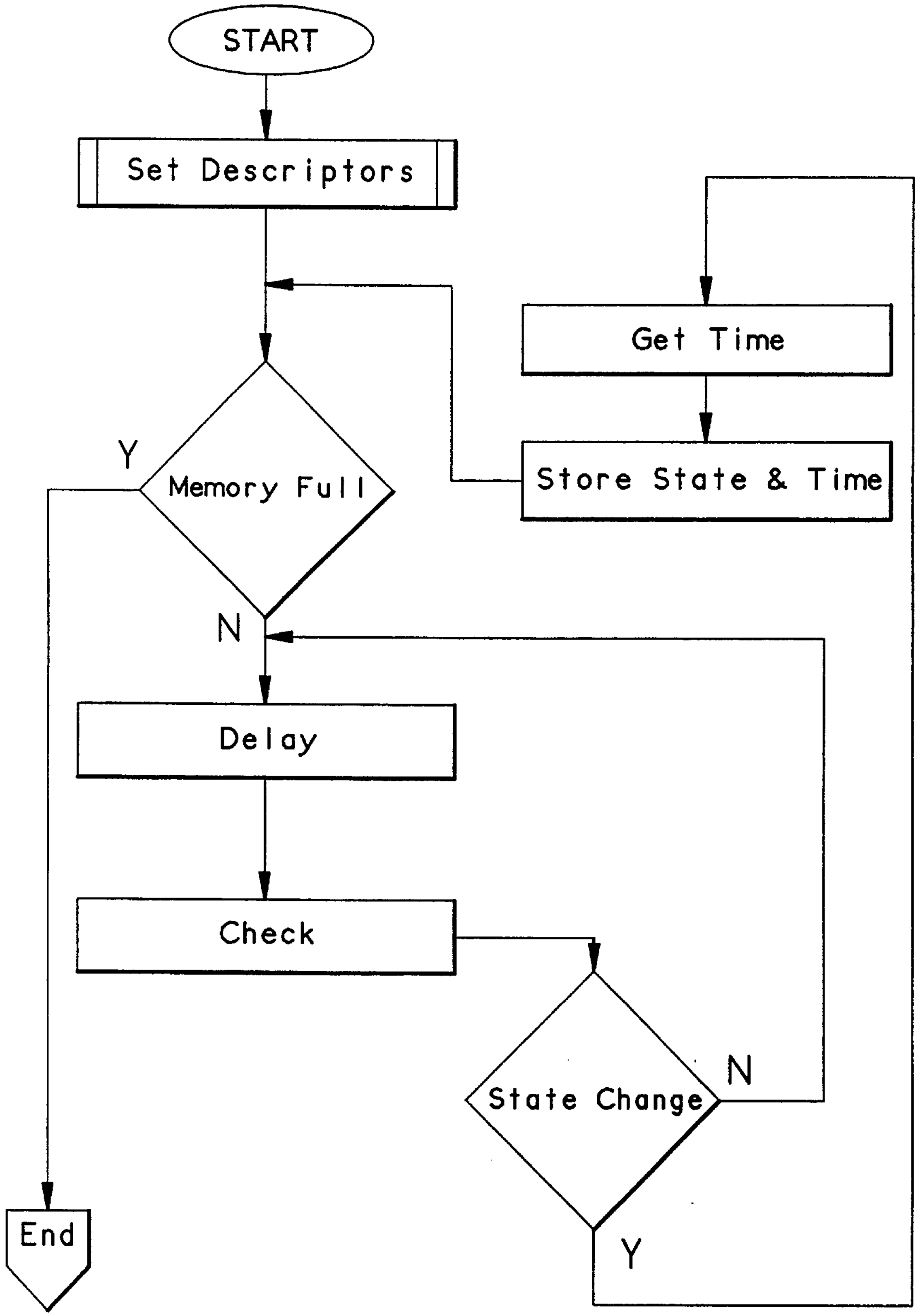
FIG. 2 is a flow chart which illustrates the operation of the control program which is executed by the microcontroller of FIG. 1.

FIG. 2 is a flow chart which illustrates the operation of the control program which is executed by the microcontroller 17 (FIG. 1) to control logging. To start the control program, a user configures the logger by entering descriptor terms which correspond to the states (open and closed) of the switch. This step is shown as the Set Descriptors block in the flow chart. If a refrigerator door were being monitored (see FIG. 3), the descriptor terms might be set such that switch closed (output voltage line=0 V) corresponds to the refrigerator door being closed and switch open (output voltage line=Voltage source) corresponds to the refrigerator door being open.

Once the control program has descriptors, a memory check is done to see if there is any open space in memory 3 (FIG. 1) to store new data. This step is shown as the Memory Full decision block in the flow chart. If no space is available, the program stops. If space is free, the program delays the check of the output voltage line 13 (FIG. 1) for 0.5 seconds. This step is shown as the Delay block in the flow chart. After the delay, the output voltage line is checked for a state change. The program may take advantage of the delay between checks to execute other housekeeping functions. Such a technique is particularly useful with microcontrollers 17 (FIG. 1) such as the PIC 16C5x which are difficult to configure to monitor the output voltage line on a continuous basis without diverting attention to look for counter overflow and incoming characters prompting serial communication.

In the step shown as the Check block in the flow chart the control program checks for a state change by sampling the output voltage line and comparing to the previous value of the output voltage line. If the state hasn't changed, the program loops back and delays checking again. (See "State Change" decision block). If the check function reveals a state change, the program proceeds to store a record of the event in memory. (See "Get Time" and "Store Time and State" blocks). When a state change is detected, the program gets a time value to associate with the change. The time value can be from a real time clock in the microcontroller or a peripheral, or a known number of time periods following a known start time. The time value and the new state are then stored in the memory. Each state change is recorded as 4 bytes in the memory. The first bit is used to mark End Of File. The second bit represents the new state. The remaining bits are used to record the time value. For the first pass through the program following start, the program will proceed as if there is a state change in order to get an initial state and time. After the time of the event is stored in memory, the program checks to see if the memory is full. If the memory is full, the program stops monitoring the output voltage line. If memory isn't full, the program continues monitoring.

In the preferred embodiment, the user enters descriptor terms and a predetermined general purpose sampling rate of about 0.5 seconds is used. However, the control program may be written so that a sampling rate can be chosen by the user. The sampling rate is the period between each successive check for a state change, i.e., the Delay of FIG. 2. The sampling rate would then be chosen such that state changes would be discovered in a timely fashion. The optimal sampling rate thus depends on the action being monitored. For example, if the action were the opening and closing of a refrigerator door, a sampling rate from about 0.5 up to several seconds would be suitable. However, if the logger is destined to monitor a much more frequently occurring action then the sampling rate would be faster. If the logger is built to monitor a specific action, a predetermined sampling rate and predetermined descriptor terms could used.

Figure 3:
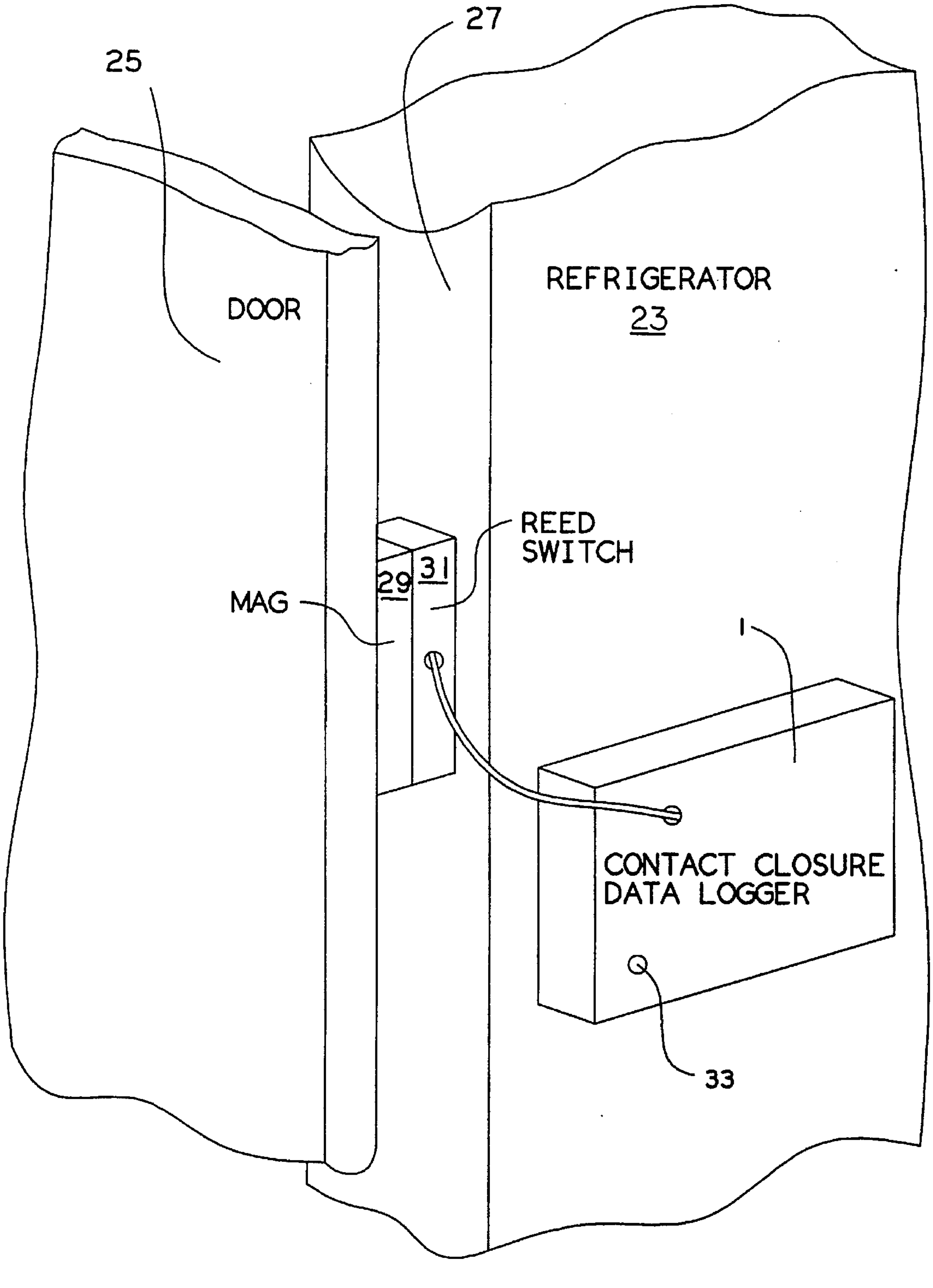
FIG. 3 illustrates the contact closure logger of FIG. 1 configured to monitor the state of a refrigerator door.

FIG. 3 illustrates a contact closure logger 1 arranged to monitor a refrigerator 23, or more particularly the state of a refrigerator door 25. The refrigerator has a door jam 27 against which the door closes. A magnet 29 is attached to the door of the refrigerator. A reed switch 31 is attached to the door jam of the refrigerator, such that the proximity of the magnet to the reed switch when the refrigerator door is closed causes the reed switch to close. When the door is opened, the reed switch opens. The logger is mounted on the refrigerator, and has a 3.5 mm serial port 33 for downloading recorded data.

Table 1 shows data gathered with a four channel contact closure logger connected to a two door refrigerator in a busy workplace. Channel 1 was connected to the freezer door, while channel 2 was connected to the refrigerator door. Channels 3 and 4 were not used. The sampling rate was preset to 1 second. The logger thus records the time of door opening and closing within 1 second of the actual time—an insignificant margin of error for the typical energy usage experiment. Of course the program could be varied to record only one particular state change, e.g., open to closed, depending on what the user wants to study.

TABLE 1

S/N 1234,
OF WRAPS = 0 LEGEND: CHAN1 = FREEZER CHAN2 = FRIG

| TIME | Date | CHAN1 | CHAN2 | CHAN3 | CHAN4 |
|---|---|---|---|---|---|
| 9:33 25 AM | 9/05/94 | CLOSED | OPEN | OPEN | OPEN |
| 9:33 37 AM | 9/05/94 | CLOSED | CLOSED | OPEN | OPEN |
| 9:33 38 AM | 9/05/94 | OPEN | CLOSED | OPEN | OPEN |
| 9:33 41 AM | 9/05/94 | CLOSED | CLOSED | OPEN | OPEN |
| 12:07 22 AM | 9/05/94 | CLOSED | OPEN | OPEN | OPEN |
| 12:07 35 AM | 9/05/94 | CLOSED | CLOSED | OPEN | OPEN |
| 7:40 13 AM | 9/06/94 | OPEN | CLOSED | OPEN | OPEN |
| 7:40 17 AM | 9/06/94 | CLOSED | CLOSED | OPEN | OPEN |
| 7:40 44 AM | 9/06/94 | OPEN | CLOSED | OPEN | OPEN |
| 7:40 47 AM | 9/06/94 | CLOSED | CLOSED | OPEN | OPEN |
| 7:46 33 AM | 9/06/94 | OPEN | CLOSED | OPEN | OPEN |
| 7:46 45 AM | 9/06/24 | CLOSED | CLOSED | OPEN | OPEN |
| 7:49 26 AM | 9/06/94 | OPEN | CLOSED | OPEN | OPEN |
| 7:43 42 AM | 9/06/94 | CLOSED | CLOSED | OPEN | OPER |
| 7:57 46 AM | 9/06/94 | OPEN | CLOSED | OPEN | OPEN |
| 7:57 55 AM | 9/06/94 | CLOSED | CLOSED | OPEN | OPEN |
| 7:59 21 AM | 9/06/94 | OPEN | CLOSED | OPEN | OPEN |
| 7:59 25 AM | 9/06/94 | CLOSED | CLOSED | OPEN | OPEN |
| 8:01 50 AM | 9/06/94 | OPEN | CLOSED | OPEN | OPEN |
| 8:01 57 AM | 9/06/94 | CLOSED | CLOSED | OPEN | OPEN |
| 8:02 50 AM | 9/06/94 | OPEN | CLOSED | OPEN | OPEN |
| 8:03 06 AM | 9/06/94 | CLOSED | CLOSED | OPEN | OPEN |
| 8:04 05 AM | 9/06/94 | OPEN | CLOSED | OPEN | OPEN |
| 8:04 25 AM | 9/06/94 | CLOSED | CLOSED | OPEN | OPEN |
| 8:05 17 AM | 9/06/94 | OPEN | CLOSED | OPEN | OPEN |
| 8:05 21 AM | 9/06/94 | CLOSED | CLOSED | OPEN | OPEN |
| 8:05 29 AM | 9/06/96 | OPEN | CLOSED | OPEN | OPEN |
| 8:05 32 AM | 9/06/94 | CLOSED | CLOSED | OPEN | OPEN |
| 8:05 36 AM | 9/06/94 | OPEN | CLOSED | OPEN | OPEN |
| 8:05 41 AM | 9/06/94 | CLOSED | CLOSED | OPEN | OPEN |
| 8:06 21 AM | 9/06/94 | OPEN | CLOSED | OPEN | OPEN |
| 8:06 28 AM | 9/06/94 | CLOSED | CLOSED | OPEN | OPEN |
| 8:06 51 AM | 9/06/94 | OPEN | CLOSED | OPEN | OPEN |
| 8:06 54 AM | 9/06/94 | CLOSED | CLOSED | OPEN | OPEN |
| 8:07 26 AM | 9/06/94 | OPEN | CLOSED | OPEN | OPEN |
| 8:07 32 AM | 9/06/94 | CLOSED | CLOSED | OPEN | OPEN |
| 8:07 46 AM | 9/06/94 | OPEN | CLOSED | OPEN | OPEN |
| 8:07 56 AM | 9/06/94 | CLOSED | CLOSED | OPEN | OPEN |
| 8:08 32 AM | 9/06/94 | OPEN | CLOSED | OPEN | OPEN |
| 8:08 36 AM | 9/06/94 | CLOSED | CLOSED | OPEN | OPEN |
| 8:13 03 AM | 9/06/94 | OPEN | CLOSED | OPEN | OPEN |
| 8:13 11 AM | 9/06/94 | CLOSED | CLOSED | OPEN | OPEN |
| 8:15 30 AM | 9/06/94 | OPEN | CLOSED | OPEN | OPEN |
| 8:15 39 AM | 9/06/94 | CLOSED | CLOSED | OPEN | OPEN |
| 8:17 08 AM | 9/06/94 | OPEN | CLOSED | OPEN | OPEN |
| 8:17 19 AM | 9/06/94 | CLOSED | CLOSED | OPEN | OPEN |
| 8:19 12 AM | 9/06/94 | OPEN | CLOSED | OPEN | OPEN |
| 8:19 21 AM | 9/06/94 | CLOSED | CLOSED | OPEN | OPEN |
| 8:27 13 AM | 9/06/94 | OPEN | CLOSED | OPEN | OPEN |
| 8:27 18 AM | 9/06/94 | CLOSED | CLOSED | OPEN | OPEN |
| 8:37 34 AM | 9/06/94 | CLOSED | OPEN | OPEN | OPEN |
| 8:37 48 AM | 9/06/94 | CLOSED | CLOSED | OPEN | OPEN |
| 8:38 11 AM | 9/06/94 | CLOSED | OPEN | OPEN | OPEN |
| 8:38 20 AM | 9/06/94 | CLOSED | CLOSED | OPEN | OPEN |
| 8:38 32 AM | 9/06/94 | CLOSED | OPEN | OPEN | OPEN |
| 8:30 39 AM | 9/06/94 | CLOSED | CLOSED | OPEN | OPEN |
| 8:39 01 AM | 9/06/94 | CLOSED | OPEN | OPEN | OPEN |
| 8:39 05 AM | 9/06/94 | CLOSED | CLOSED | OPEN | OPEN |
| 8:39 21 AM | 9/06/94 | CLOSED | OPEN | OPEN | OPEN |
| 8:39 34 AM | 9/06/94 | CLOSED | CLOSED | OPEN | OPEN |
| 8:39 38 AM | 9/06/94 | OPEN | CLOSED | OPEN | OPEN |
| 8:39 44 AM | 9/06/94 | CLOSED | CLOSED | OPEN | OPEN |
| 8:39 45 AM | 9/06/94 | OPEN | CLOSED | OPEN | OPEN |
| 8:39 49 AM | 9/06/94 | CLOSED | CLOSED | OPEN | OPEN |
| 8:39 57 AM | 9/06/94 | CLOSED | OPEN | OPEN | OPEN |
| 8:40 06 AM | 9/06/94 | CLOSED | CLOSED | OPEN | OPEN |
| 8:40 06 AM | 9/06/94 | OPEN | CLOSED | OPEN | OPEN |
| 8:40 08 AM | 9/06/94 | CLOSED | CLOSED | OPEN | OPEN |

TABLE 1-continued

| S/N 1234, # OF WRAPS = 0 LEGEND: CHAN1 = FREEZER CHAN2 = FRIG | | | | | |
|---|---|---|---|---|---|
| TIME | Date | CHAN1 | CHAN2 | CHAN3 | CHAN4 |
| 8:40 24 AM | 9/06/94 | CLOSED | OPEN | OPEN | OPEN |
| 8:40 29 AM | 9/06/94 | CLOSED | CLOSED | OPEN | OPEN |
| 8:42 41 AM | 9/06/94 | CLOSED | OPEN | OPEN | OPEN |
| 0:42 45 AM | 9/06/94 | CLOSED | CLOSED | OPEN | OPEN |
| 8:43 05 AM | 9/06/94 | CLOSED | OPEN | OPEN | OPEN |
| 8:43 09 AM | 9/06/94 | CLOSED | CLOSED | OPEN | OPEN |
| 8:43 55 AM | 9/06/94 | OPEN | CLOSED | OPEN | OPEN |
| 8:43 58 AM | 9/06/94 | CLOSED | CLOSED | OPEN | OPEN |
| 8:44 42 AM | 9/06/94 | OPEN | CLOSED | OPEN | OPEN |
| 8:44 46 AM | 9/06/94 | CLOSED | CLOSED | OPEN | OPEN |
| 8:44 51 AM | 9/06/94 | CLOSED | CLOSED | OPEN | OPEN |
| 8:44 53 AM | 9/06/94 | OPEN | CLOSED | OPEN | OPEN |
| 8:45 41 AM | 9/06/94 | CLOSED | CLOSED | OPEN | OPEN |
| 8:46 07 AM | 9/06/94 | CLOSED | OPEN | OPEN | OPEN |
| 8:51 43 AM | 9/06/94 | CLOSED | CLOSED | OPEN | OPEN |
| 8:52 11 AM | 9/06/94 | CLOSED | CLOSED | OPEN | OPEN |
| 8:52 26 AM | 9/06/94 | OPEN | CLOSED | OPEN | OPEN |
| 8:52 29 AM | 9/06/94 | CLOSED | CLOSED | OPEN | OPEN |
| 8:52 35 AM | 9/04/94 | CLOSED | CLOSED | OPEN | OPEN |
| 8:52 38 AM | 9/06/94 | OPEN | CLOSED | OPEN | OPEN |
| 8:52 57 AM | 9/06/94 | OPEN | CLOSED | OPEN | OPEN |
| 8:53 04 AM | 9/06/94 | CLOSED | CLOSED | OPEN | OPEN |
| 8:53 58 AM | 9/06/94 | OPEN | CLOSED | OPEN | OPEN |
| 8:54 03 AM | 9/06/94 | CLOSED | CLOSED | OPEN | OPEN |
| 8:59 00 AM | 9/06/94 | OPEN | CLOSED | OPEN | OPEN |
| 8:59 11 AM | 9/06/94 | CLOSED | CLOSED | OPEN | OPEN |
| 9:02 20 AM | 9/06/94 | OPEN | CLOSED | OPEN | OPEN |
| 9:02 24 AM | 9/06/94 | CLOSED | CLOSED | OPEN | OPEN |
| 9:02 32 AM | 9/06/94 | OPEN | CLOSED | OPEN | OPEN |
| 9:02 35 AM | 9/06/94 | CLOSED | CLOSED | OPEN | OPEN |
| 9:54 28 AM | 9/06/94 | OPEN | CLOSED | OPEN | OPEN |
| 9:54 31 AM | 9/06/94 | CLOSED | CLOSED | OPEN | OPEN |
| 9:54 35 AM | 9/06/94 | OPEN | CLOSED | OPEN | OPEN |
| 9:54 38 AM | 9/06/94 | CLOSED | CLOSED | OPEN | OPEN |
| 9:56 36 AM | 9/06/94 | OPEN | CLOSED | OPEN | OPEN |
| 9:56 45 AM | 9/06/94 | CLOSED | CLOSED | OPEN | OPEN |
| 9:58 28 AM | 9/06/94 | OPEN | CLOSED | OPEN | OPEN |
| 9:58 39 AM | 9/06/94 | CLOSED | CLOSED | OPEN | OPEN |

It will be appreciated by those skilled in the art that such a contact closure logger has great potential or industrial and domestic energy usage studies.

Figure 4:
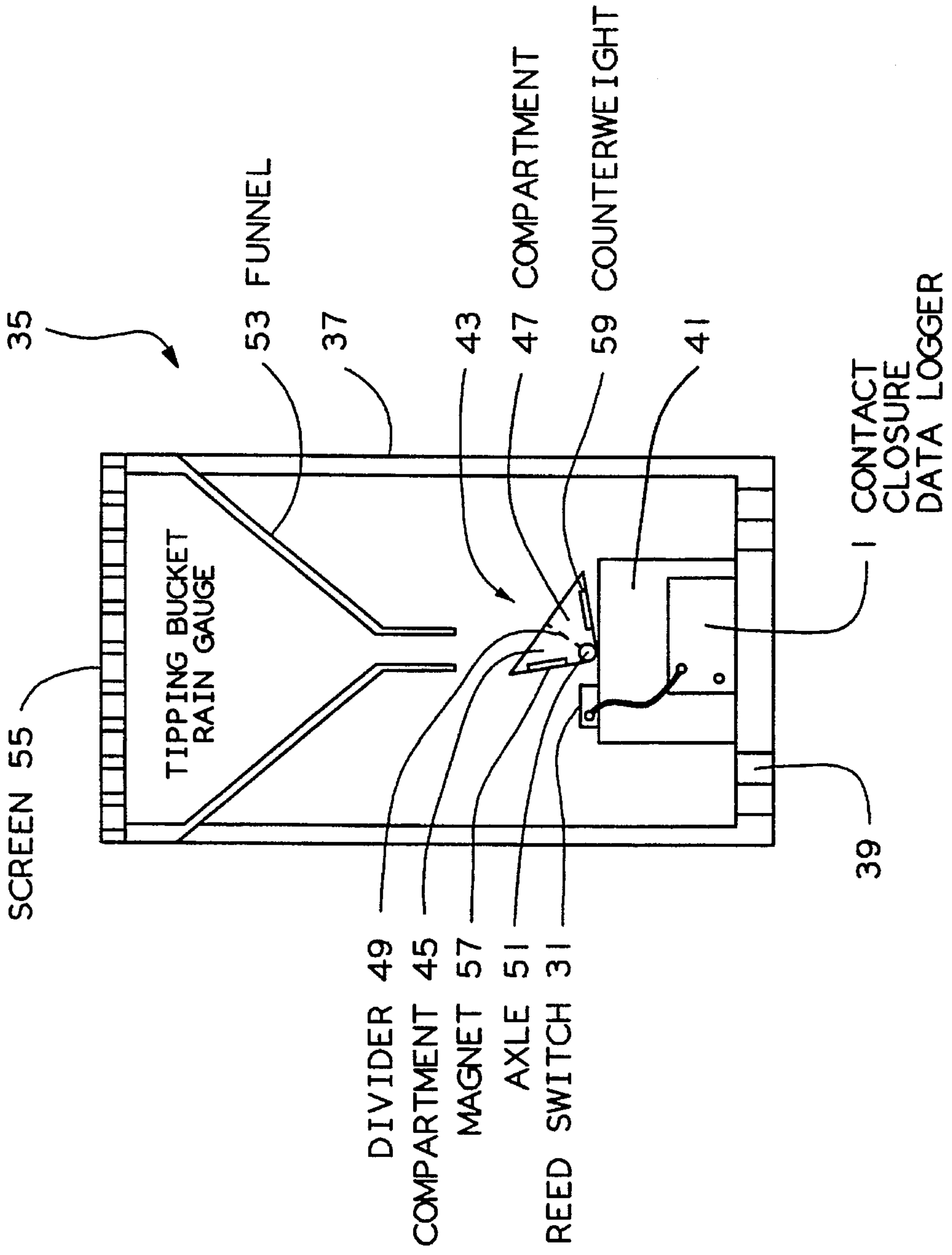
FIG. 4 illustrates the contact closure logger of FIG. 1 configured to monitor a tipping bucket rain gauge.

FIG. 4 illustrates the contact closure logger 1 arranged to monitor rainfall (not illustrated) in conjunction with a tipping bucket rain gauge 35. The tipping bucket rain gauge includes a cylindrical housing 37 with a perforated bottom 39, a platform 41 which is disposed on the perforated bottom and a bucket 43 which is disposed on the platform. The bucket has first 45 and second 47 compartments which are separated by a divider 49. The bucket moves pivotally on an axle 51. A funnel 53 with a perforated screen 55 sits on the cylindrical housing. The contact closure logger 1 is disposed on the platform. A magnet 57 and a counterweight 59 are disposed on the bucket.

The contact closure logger operates to record bucket tipping cycles. Rain enters the rain gauge 35 through the perforated screen 55 and is directed by the funnel 53 into the first compartment 45. When a predetermined weight/volume of water has entered the first compartment, the bucket is forced to pivot (tip) on the axle 51 by the weight of the water. The water in the first compartment then empties while the second compartment begins to fill. The emptied rainwater exits the gauge through the perforated bottom. The counterweight 59 is positioned to compensate for the weight of the magnet 57, so an equal weight of water will tip the bucket in either direction. The reed switch 31 is disposed on the platform such that the switch will be closed when the bucket tips in one particular direction, i.e., once per tipping cycle. Alternatively, switches could be placed on either side of the bucket to record each tip event. Either way, the data provided allows detailed study of rainfall including rate over any chosen period and total rainfall.

Figure 5:
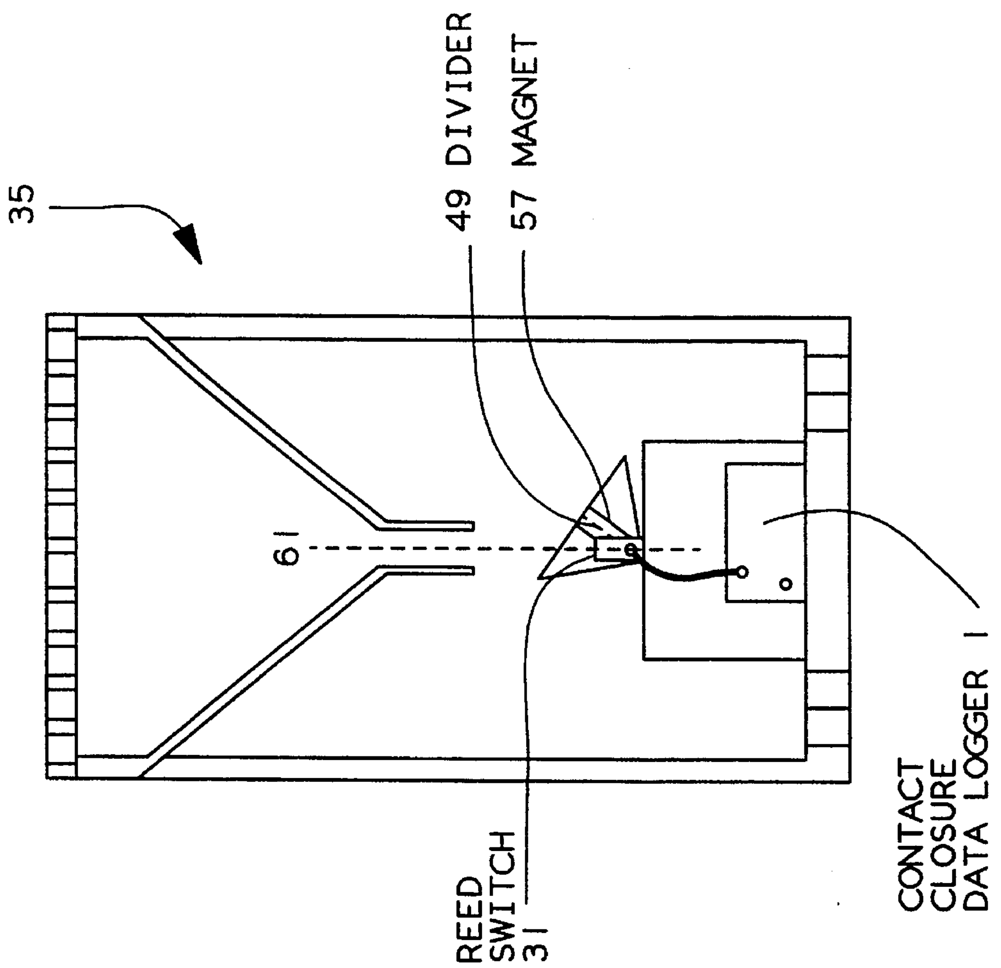
FIG. 5 illustrates an alternative embodiment of the tipping bucket rain gauge monitor of claim 4.

FIG. 5 illustrates an alternative embodiment of the contact closure logger 1 arranged to monitor rainfall in conjunction with the tipping bucket rain gauge 35. In this embodiment, the magnet 57 is attached along the divider 49 and the reed switch 31 is arranged to respond when the magnet passes a midpoint 61 between tips. Depending on the location the magnet, the switch may be disposed along an axis which is perpendicular to the platform.

This embodiment will store the time of each tipping event. However, regardless of whether the time of each event or only each tipping cycle is stored, the present invention is substantially more useful than mechanical counters which are presently in use with tipping bucket rain gauges. Mechanical counters offer only one piece of information: total rainfall during deployment. With the present invention it is possible to determine total, average and rate of rainfall between any two points in time during deployment.

Figure 6:
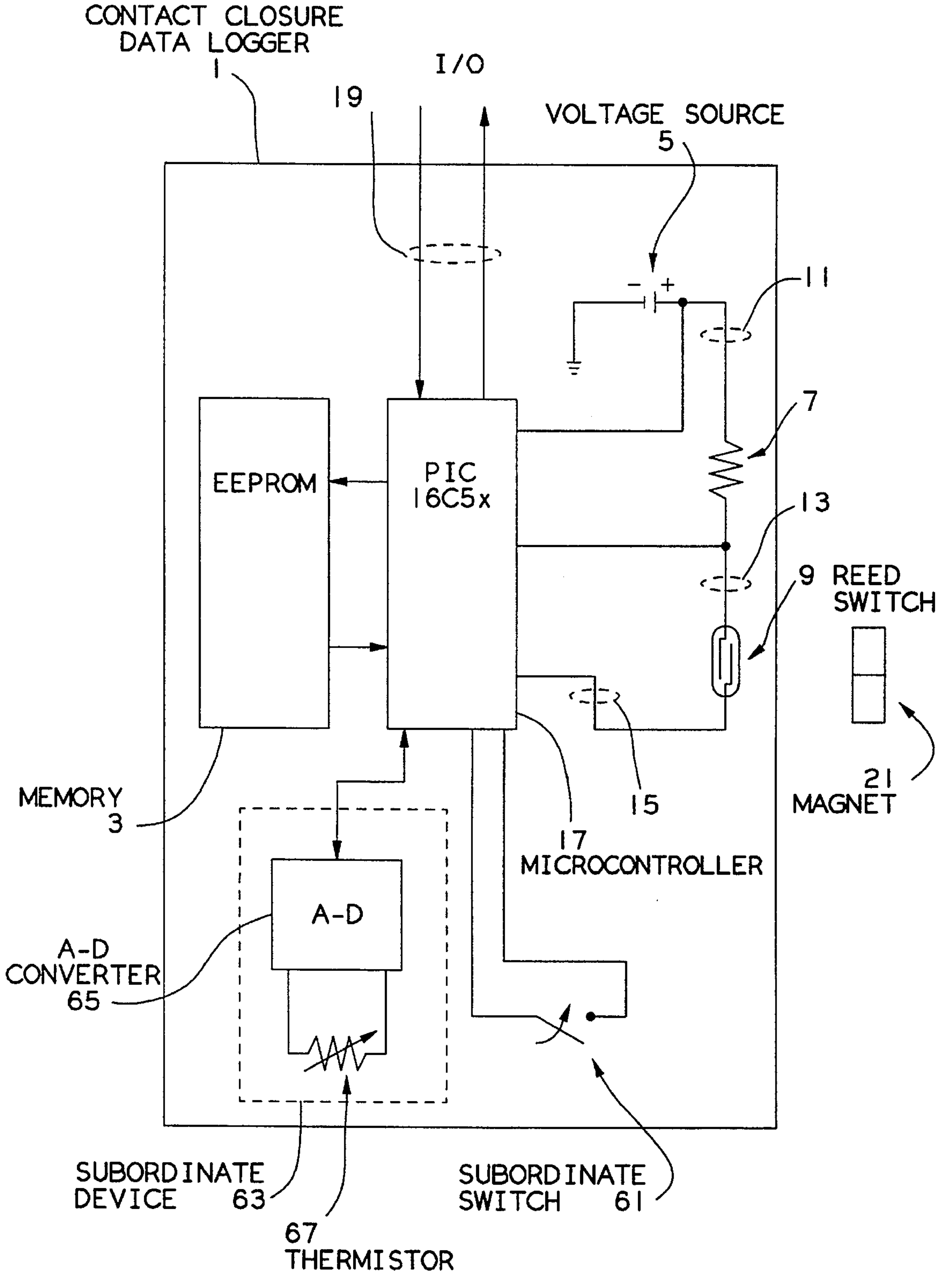
FIG. 6 is a schematic/block diagram of an alternative embodiment of the contact closure data logger of FIG. 1.

FIG. 6 is a schematic/block diagram of an alternative embodiment of the contact closure data logger of FIG. 1. In this alternative embodiment, the contact closure logger 1 has one or more dependent elements such as subordinate switch 61 and a subordinate measurement device 63. The device 63 may include an analog to digital (A-D) converter 65 and a thermistor 67, or any other device (either analog or digital) which measures a physical property. The subordinate switch 61 is connected to the microcontroller 17. The A-D converter 65 is connected to the microcontroller 17 and the subordinate measurement device 63. The switch 61 and device 63 are subordinate in the sense that their status is checked based on the state of the (main) switch 9. For example, the microcontroller 17 could record the state of the subordinate switch 61 and an A-D reading, or series of A-D readings, reflecting temperature via the subordinate measurement device 63 each time the (main) switch 9 changes state, or when the (main) switch 9 changes to some particular state. This alternative embodiment is particularly well suited to such energy usage studies as changes in room temperature caused by use of doors and windows. It could also be used in conjunction with the tipping bucket rain gauges of FIGS. 4 & 5 to record such properties as temperature, pressure and relative humidity before, during and after rain storms.

Figure 7:
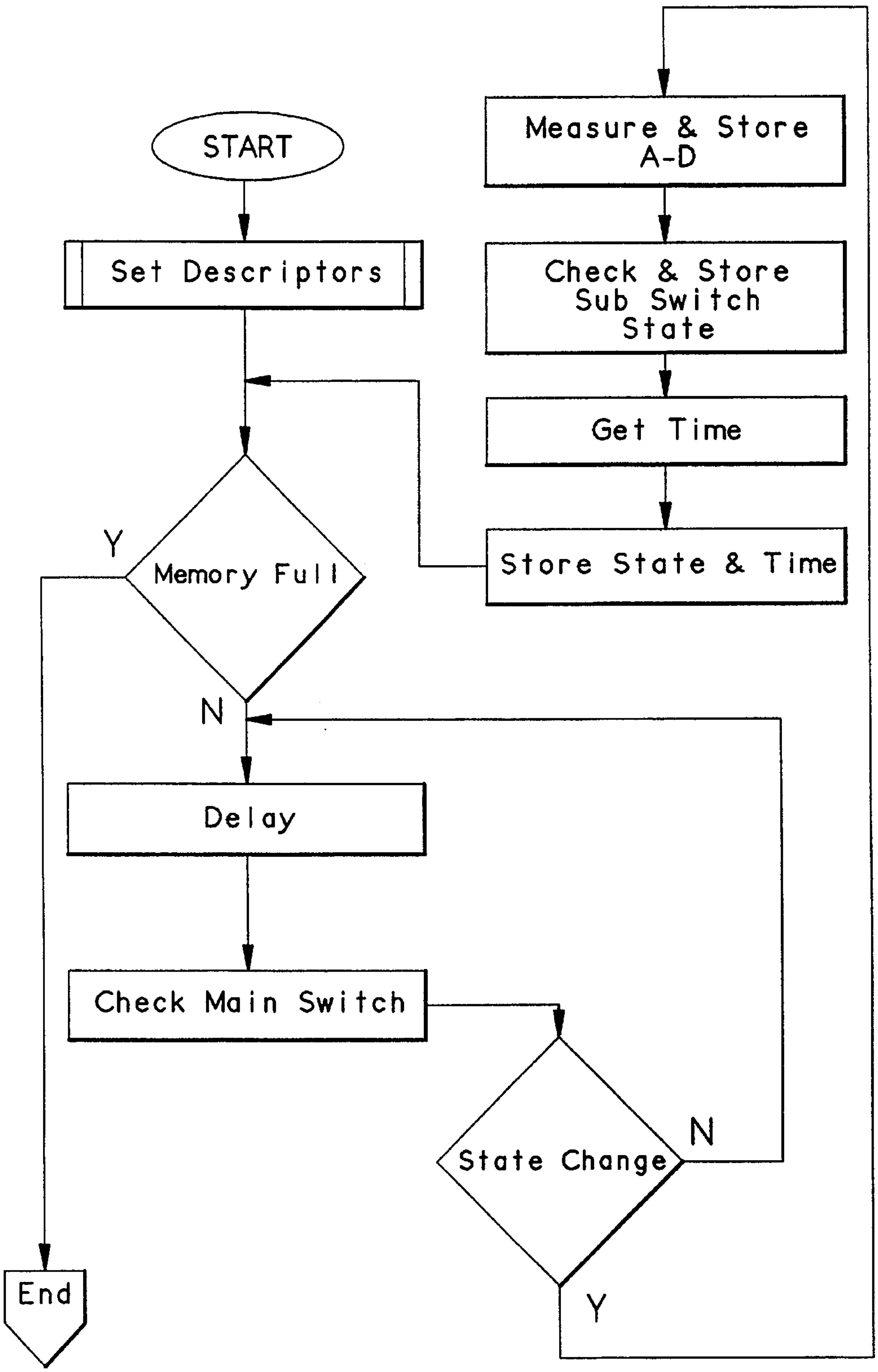
FIG. 7 is a flow chart which illustrates the operation of a control program which is executed by the microcontroller of FIG. 6.

FIG. 7 is a flow chart which illustrates the operation of a control program which is executed by the microcontroller of FIG. 6. This control program operates in substantially the same fashion as the control program of FIG. 2. However, when a state change in the (main) switch 9 (FIG. 6) is detected, action is undertaken with regard to the subordinate switch 61 (FIG. 6) and subordinate measurement device 63 (FIG. 6). In this embodiment, the control program checks the state of the subordinate switch 61 (FIG. 6), and records the state of the subordinate switch 61 (FIG. 6) when a state change in the (main) switch 9 (FIG. 6) is detected. Then, a measurement of a physical property is taken and stored with the A-D converter 65 (FIG. 6). The state of the (main) switch and the time of the state change are also stored, as they were in the control program of FIG. 2.

Of course, a variety of dependent measurement hierarchies could be developed using this technique. For example, the measurement of the physical property taken with the A-D converter could be dependent on the state of the subordinate switch rather than the (main) switch. Those skilled in the art will appreciate how to construct a hierarchical contact closure logger for any particular mission in light of the present disclosure.

A variety of modifications and variations of the present invention are possible in light of the above teachings. It is therefore to be understood that, within the scope of the appended claims, the present invention may be practiced otherwise than specifically described hereinabove.

What is claimed is:

1. A contact closure data logger which monitors state changes which occur at a given time, comprising:

a microcontroller which executes a control program;

a memory operationally connected to said microcontroller to store data;

a switch connected between an output voltage line and a switched reference line to provide a contact closure indicative of an action being monitored, said output voltage line connecting said switch to said microcontroller and a current limiting resistor, said switched reference line connecting said switch to said microcontroller, said microcontroller providing a ground or a positive reference voltage on said switched reference line, said switch having two states; and a battery for supplying a voltage across said switch, said battery connected to a reference voltage line, said reference voltage line connecting said battery to said microcontroller and said current limiting resistor;

wherein said control program directs said microcontroller to provide said ground on said switched reference line while further directing said microcontroller to check said output voltage line for a voltage and compare said voltage to a previous voltage on said output voltage line, and then to provide said positive reference voltage on said switched reference line for a delay period until a subsequent check of said output voltage line is made, a record of any change in state being recorded by storing the time at which such state change occurred in said memory.

2. The contact closure data logger of claim 1, wherein said delay period is from about 0.5 to several seconds.

3. A contact closure data logger which monitors state changes which occur at a given time, comprising:

a microcontroller having first, second and third terminals, and executing a control program;

a memory operationally connected to said microcontroller to store data;

a switch connected between an output voltage line and a switched reference line to provide a contact closure indicative of an action being monitored, said output voltage line connecting said switch to said second terminal of said microcontroller and a current limiting resistor, said switched reference line connecting said switch to said third terminal of said microcontroller, said microcontroller providing a ground or a positive reference voltage on said switched reference line through said third terminal, said switch having two states; and a battery having first and second terminals for supplying a voltage, said first terminal of said battery being connected to ground and said second terminal of said battery being connected to a reference voltage line, said reference voltage line connecting said second terminal of said battery to said first terminal of said microcontroller and said current limiting resistor.

* * * * *

UNITED STATES PATENT AND TRADEMARK OFFICE

CERTIFICATE OF CORRECTION

PATENT NO. : 5,623,416
DATED : April 22, 1997
INVENTOR(S) : Lon O. Hocker, III

It is certified that error appears in the above-identified patent and that said Letters Patent is hereby corrected as shown below:

Column 7,
Table 1, line 19, "9/04/94" should read -- 9/06/94 --; and "CLOSED" (first occurrence) should read -- OPEN --;
Line 20, "OPEN" (first occurrence) should read -- CLOSED --; and
Line 41, "or" should read -- for --.

Signed and Sealed this

Twentieth Day of August, 2002

*Attest:*

JAMES E. ROGAN

*Attesting Officer*

*Director of the United States Patent and Trademark Office*